United States Patent
Tan et al.

(10) Patent No.: US 8,716,856 B2
(45) Date of Patent: May 6, 2014

(54) DEVICE WITH INTEGRATED POWER SUPPLY

(75) Inventors: Juan Boon Tan, Singapore (SG); Yeow Kheng Lim, Singapore (SG); Soh Yun Siah, Singapore (SG); Wei Liu, Singapore (SG); Shunqiang Gong, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 5 days.

(21) Appl. No.: 13/565,748

(22) Filed: Aug. 2, 2012

(65) Prior Publication Data

US 2014/0035155 A1    Feb. 6, 2014

(51) Int. Cl.
*H01L 23/52* (2006.01)

(52) U.S. Cl.
USPC ............................ 257/691; 257/686; 438/107

(58) Field of Classification Search
USPC .......... 257/686, 777, 691, 723, 724; 438/107, 438/109, 11
See application file for complete search history.

(56) References Cited

U.S. PATENT DOCUMENTS

| | | | |
|---|---|---|---|
| 6,355,501 B1 * | 3/2002 | Fung et al. ................ | 438/107 |
| 8,247,895 B2 * | 8/2012 | Haensch et al. ........... | 257/686 |
| 2010/0164084 A1 * | 7/2010 | Lee et al. ................. | 257/686 |
| 2013/0093073 A1 * | 4/2013 | Chen et al. ............... | 257/686 |

* cited by examiner

*Primary Examiner* — Sheila V. Clark
(74) *Attorney, Agent, or Firm* — Horizon IP Pte Ltd

(57) ABSTRACT

Semiconductor devices and methods for forming a semiconductor device are disclosed. The semiconductor device includes a die. The die includes a die substrate having first and second major surfaces. The semiconductor device includes a power module disposed below the second major surface of the die substrate. The power module is electrically coupled to the die through silicon via (TSV) contacts.

20 Claims, 9 Drawing Sheets

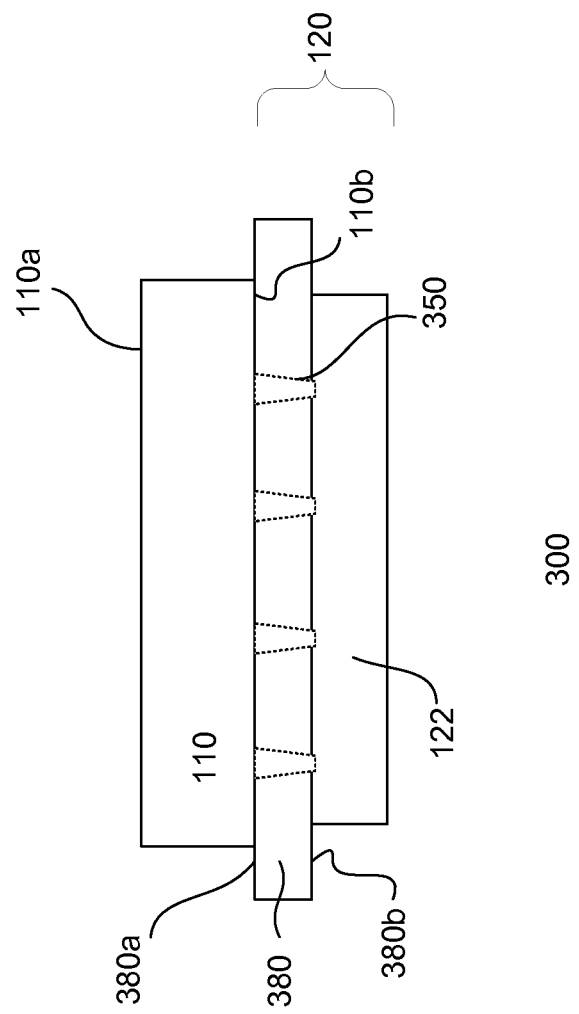

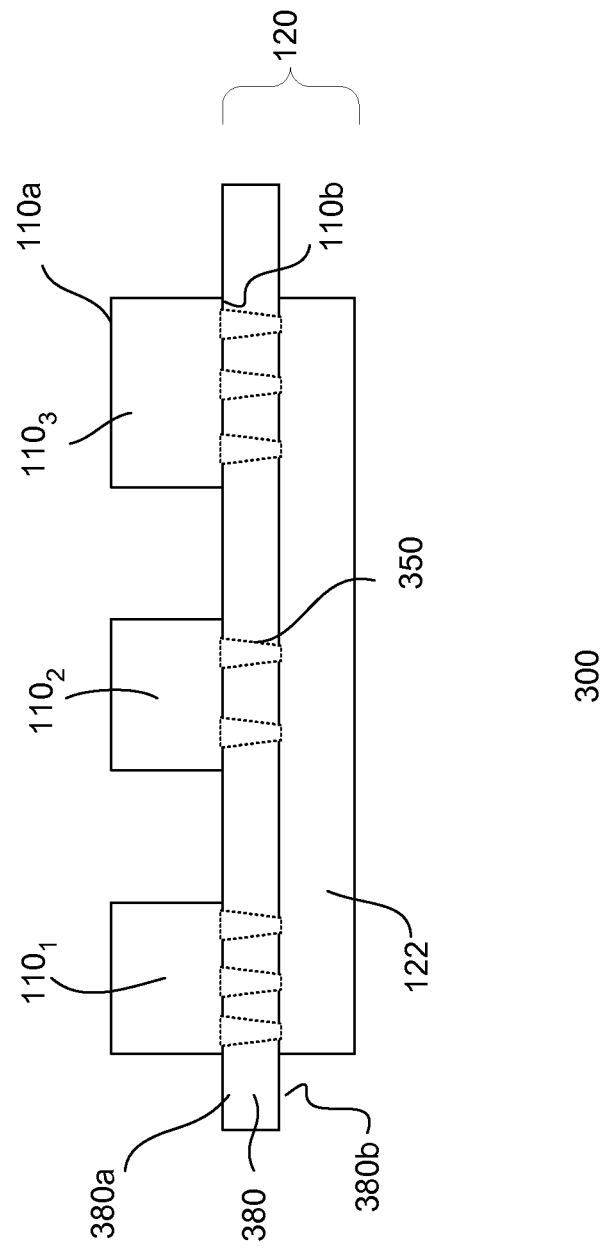

DEVICE WITH INTEGRATED POWER SUPPLY

BACKGROUND

As technology evolves into era of sub-micron, there is a desire to integrate different circuit elements into a single chip or integrated circuit (IC). There is also a desire to integrate different chips both vertically and horizontally in a single package to form a 2.5D or 3D IC package. Nevertheless, it is difficult to integrate these different types of devices in a single chip or a single package. Particularly, some of these devices may have different power requirements. Sometimes, additional voltage regulators or charge pumps, etc. may be employed to cater for different circuits which require different power supplies. Hence, additional circuit and long power supply line are generally used to provide power supply to the whole chip or package. These undesirably consume a lot of power and chip or package space and are not effective in providing power to the different devices.

From the foregoing discussion, it is desirable to provide a device with high circuit performance which requires less power consumption and/or with reduced chip or package size. It is also desirable to provide a smaller product which enhances portability. In addition, it is desirable to provide a process for forming a device which is fully compatible with the process for forming 2.5D and 3D IC or package in the future.

SUMMARY

Embodiments generally relate to semiconductor devices. In one embodiment, a semiconductor device is disclosed. The semiconductor device includes a die. The die includes a die substrate having first and second major surfaces. The semiconductor device includes a power module disposed below the second major surface of the die substrate. The power module is electrically coupled to the die through silicon via (TSV) contacts.

In another embodiment, a method for forming a semiconductor device is presented. The method includes providing a die. The die includes a die substrate having first and second major surfaces. A power module is provided below the second major surface of the die substrate. The power module is electrically coupled to the die through silicon via (TSV) contacts.

In yet another embodiment, a method for forming a semiconductor device is presented. The method includes providing a wafer having first and second major surfaces. A power module is provided below the second major surface of the wafer. The power module is electrically coupled to the wafer through silicon via (TSV) contacts.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

Various embodiments of the invention are described with reference to the following drawings, in which:

FIGS. 3a-c show other embodiments of a semiconductor device; and

DETAILED DESCRIPTION

Embodiments relate to semiconductor devices or integrated circuits (ICs). The semiconductor devices may include one or more dies. For the case of more than one die, the dies may be arranged in a planar arrangement, vertical arrangement, or a combination thereof. The die, for example, may include memory device, logic device, communication device, optoelectronic device, digital signal processor (DSP), microcontroller, system-on-chip (SOC) as well as other types of device or a combination thereof. Such semiconductor device may be incorporated into electronic products or equipments, such as phones, computers, mobile smart products, etc.

Figure 1A:
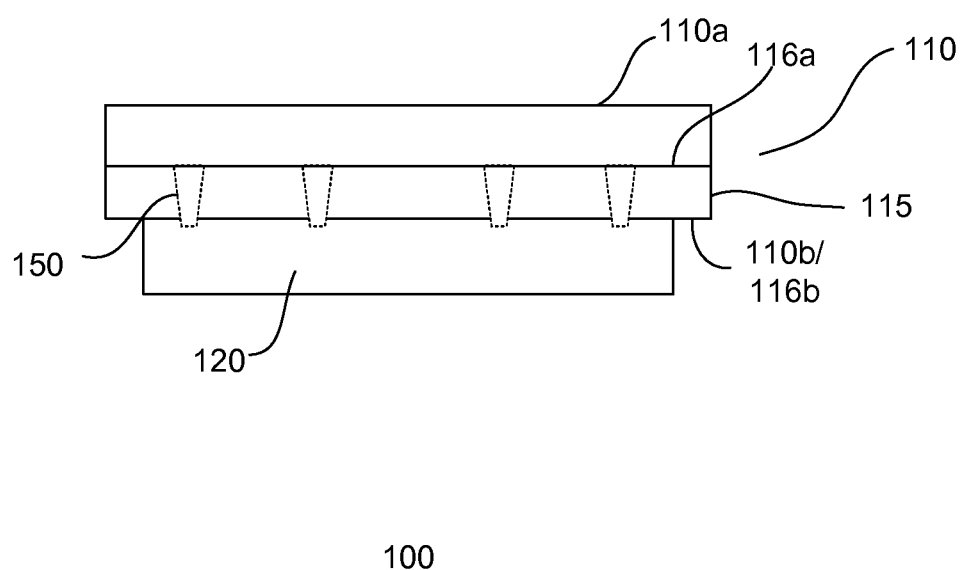
FIGS. 1a-c show various views of an embodiment of a semiconductor device.
Figure 1B:
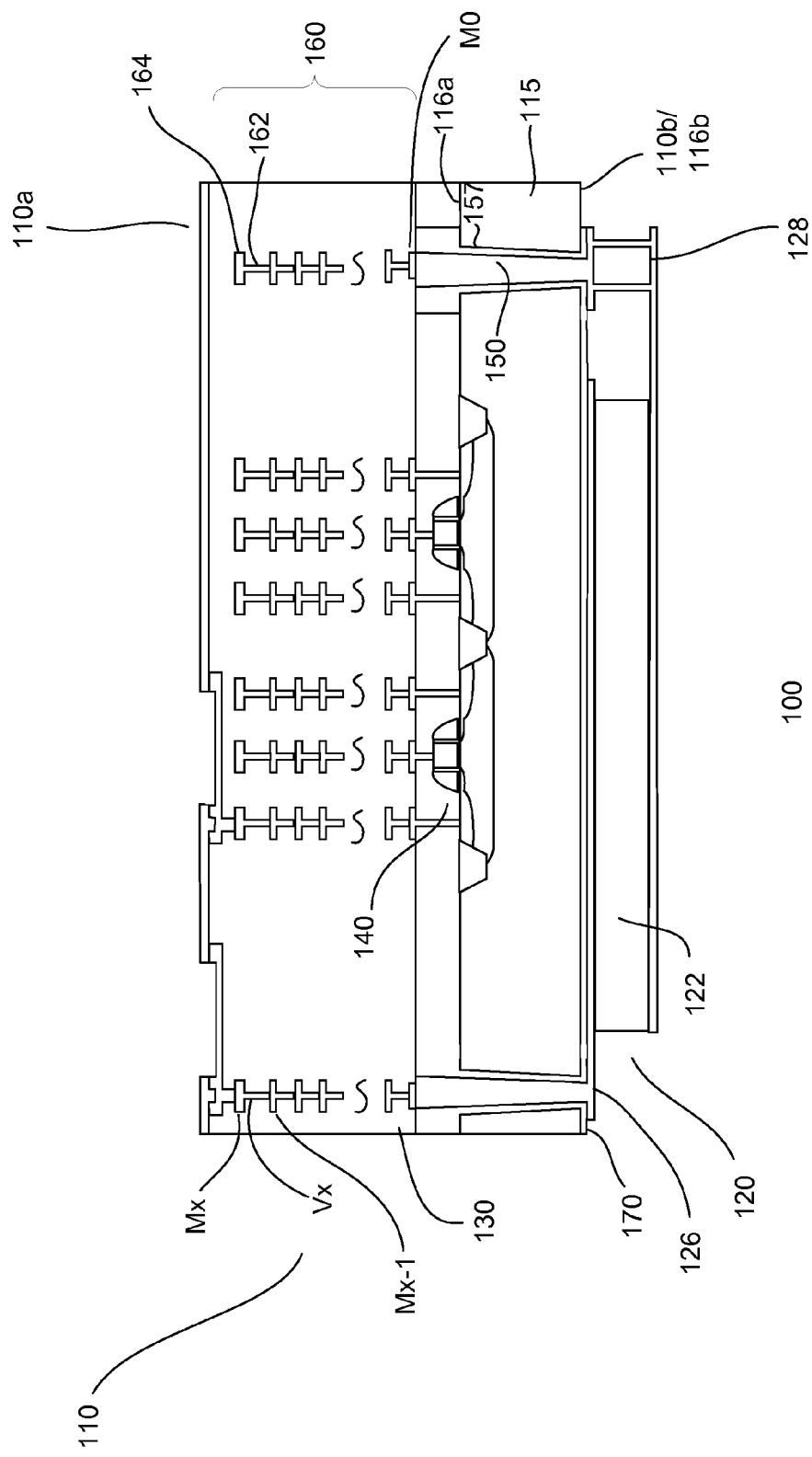

FIG. 1a shows a simplified side view of an embodiment of a semiconductor device 100 while FIG. 1b shows a cross-sectional view of the semiconductor device. Referring to FIGS. 1a-b, the semiconductor device is a device package with a die 110. The die may be a singulated die. For example, a wafer is processed to have a plurality of dies. The processed wafer is diced to singulate the dies.

The die includes a die substrate 115. The die substrate may be a semiconductor substrate. For example, the die substrate may be a silicon substrate. Other types of semiconductor substrates may also be useful. For example, the die substrate may be a silicon-on-insulator, silicon germanium or other types of semiconductor substrates. The die substrate includes first and second major substrate surfaces 116a-b. The first major substrate surface 116a, for example, may be referred to as the front or active substrate surface and the second major surface 116b, for example, may be referred to as the back or inactive substrate surface. Other designations for the surfaces may also be useful.

The inactive substrate surface may serve as a bottom die surface 110b. The bottom die surface may be lined with a dielectric layer 170. The active surface is the surface of the substrate on which circuit components 140 are formed. The components, for example, include transistors having gate and source/drain (s/d) regions. Providing other types of circuit components may also be useful. For example, the substrate may include a combination of active and passive components.

The components may be interconnected by interconnects 164 disposed on one or more metal levels 160. The metal levels, for example, are disposed over a dielectric layer 130 on the first surface of the substrate. The dielectric layer serves as a pre-metal dielectric (PMD) layer. The PMD layer, for example, may be silicon oxide. Other types of dielectric materials may also serve as the PMD layer. Typically, contacts are used to connect front end devices, such as source/drain and gate of the transistor, to the interconnect metal layer. The contacts, for example, are tungsten contacts. Other types of conductive materials can serve as contacts. A first metal level (e.g., M0) is disposed on the PMD layer. The first metal level includes interconnects 164 formed in an intra-metal dielectric (IMD) layer. The interconnects, for example, are copper or copper alloy interconnects. Other types of conductive materials, such as Aluminum (Al), etc., may be used to form the interconnects.

Additional metal levels may be disposed over the first metal level. A metal level is formed in an interconnect dielectric (ICD) layer. An ICD layer, for example, includes lower and upper portions. The lower portion serves as an inter-level dielectric (ILD) layer while the upper portion serves as an intra-metal IMD layer. The IMD layer includes interconnects 164 of metal level Mx and the ILD includes via contact 162 of via level Vx, where x correponds to a number of the metal level. For example, x is from 1 to the top metal level. Via contacts of via level Vx couples interconnects of Mx to interconnects of metal level Mx−1 below. Other configurations or designations of levels or layers may also be useful.

The ILD layer can be a single layer or a multi-layered dielectric stack. For example, a single layer can be used to serve as both the ILD and IMD or separate layers are used for the ILD and IMD. An etch stop layer may be provided between the ILD and IMD layers as well as between ICD layers. For multi-layered ICD, the ILD and IMD can include the same or different materials.

The dielectric material of the ICD may include a low-k (LK) or ultra low-k (ULK) dielectric material. Various types of low-k or ultra low-k materials, such as organo-silicate glass (OSG), fluorine-doped silicate glass (FSG) or SiCOH can be employed. Other types of dielectric materials are also useful. For example, the dielectric layer can include silicon oxide, doped silicon oxide such as fluorinated silicon oxide (FSG), undoped or doped silicate glasses such as boron phosphate silicate glass (BPSG) and phosphate silicate glass (PSG), undoped or doped thermally grown silicon oxide, undoped or doped TEOS deposited silicon oxide.

A top die surface 110a may include die contact pads which are coupled to the interconnects in the metal levels. In one embodiment, the contact pads may include ball bumps, forming a flip chip.

A power module 120 is integrated into the device package. The power module includes a power source 122. The power source, in one embodiment, is a battery cell. The battery cell, for example, is a lithium battery cell. In another embodiment, the power source is a solar cell. Other types of power sources, such as Nickel Metal Hydride (NIMH) battery, may also be useful. The power source may provide a voltage to operate the IC or die. The power module may also provide multiple voltages for operating the IC. For example, multiple power sources may be employed to provide multiple voltages. The multiple power sources may be connected to provide multiple voltages, depending on the requirements and application of the device. The power sources may be connected in series to achieve a higher voltage, or connected in parallel to increase the power current. Other lead configurations of power sources, such as a combination of parallel and series connected sources, may also be useful.

The power module includes at least first and second terminals 126 and 128. For example, the power module includes first and second terminals. One of the terminals is a positive terminal and the other is a negative terminal. In the case where multiple (n) voltages are provided by the power module, it includes n+1 terminals. For example, n positive terminals and 1 negative terminal are provided. The power module, in one embodiment, is disposed on the second surface of the die. For example, the power module is disposed on and contacts the second surface of the die. In embodiment, the power source is disposed on the inactive surface of the die. As shown, leads of the terminals are disposed on opposing surfaces of the power source. Other configurations, such as providing leads on one surface of the power source, may also be useful.

The die, in one embodiment, includes through silicon via (TSV) contacts 150. The TSV contacts are formed in through silicon vias (TSVs).

The TSV contacts may be extended to the top die surface by interconnections through, for example, the ICD layers or metal levels. In other embodiments, the TSV contacts may extend through the die surfaces. Other configurations of TSV contacts may also be useful. A redistribution layer (RDL) may be disposed on the top die surface. The RDL includes conductive traces which couple the TSV contacts to the die contact pads. An insulating liner 157 may be provided to line the sidewalls of the TSVs.

The TSVs are coupled directly to the terminals of the power module disposed on the backside of the die. Providing any suitable number of TSV contacts may be useful. The TSV contacts are coupled to the die pads by, for example, the RDL layer. This enables the power module to supply voltage or voltages directly to the die or other dies.

Figure 1C:
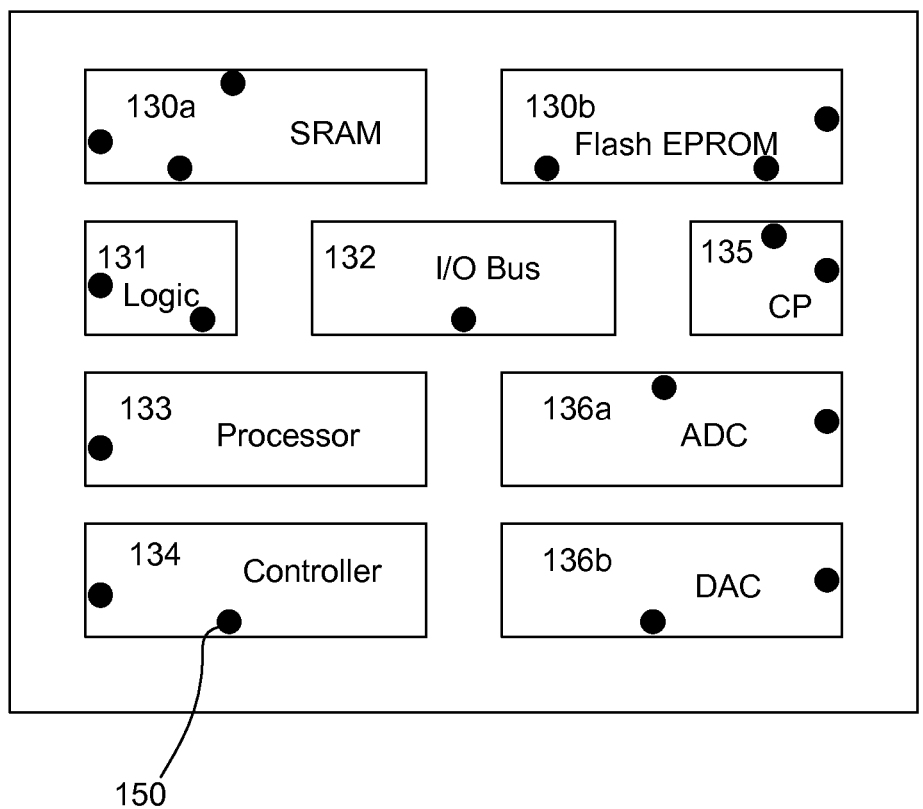

FIG. 1c shows a simplified layout of an embodiment of a die 110. As shown, the die is a SOC chip. The SOC chip includes a plurality of functional modules formed on the die substrate. For example, the SOC chip may include a plurality memory modules, such as SRAM and flash EPROM modules 130a-b, a logic module 131, an I/O bus module 132, a processor module 133, a microcontroller module 134, a charge pump module 135, an analog-to-digital converter module 136a and a digital-to-analog convertor module 136b. The SOC chip may include other types of modules. These modules are interconnected and powered directly by the battery disposed on the backside of the chip or die, forming a system on the die. Other types of chip designs may also use a similar design concept.

Figure 2:
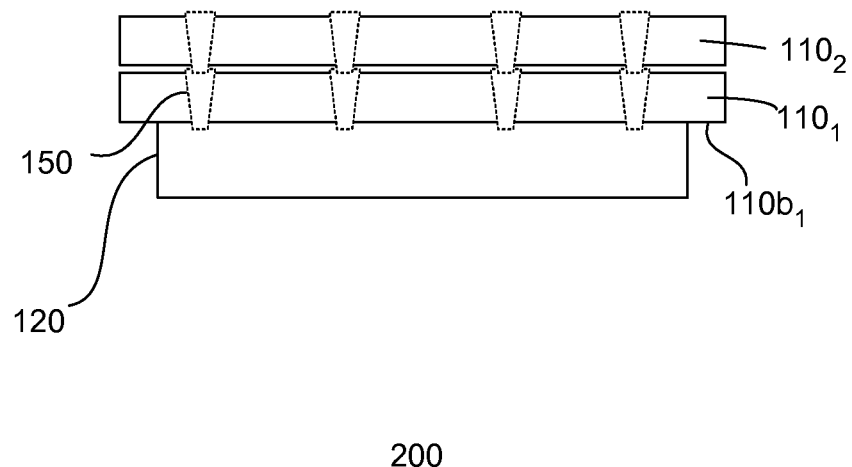
FIG. 2 show another embodiment of a semiconductor device.

FIG. 2 illustrates another embodiment of a semiconductor device 200. The semiconductor device is similar to that described in FIGS. 1a-b. As such, common elements may not be described or described in detail. The semiconductor device 200, in one embodiment, includes a die stack. The die stack includes x number of dies, where x is ≥2. For example, the die stack includes dies $110_{1-x}$. Illustratively, the die stack includes two dies, a bottom die $110_1$ and a top die $110_2$. Providing a die stack with other number of dies may also be useful. For die stacks with more than 2 dies, intermediate dies $110_{2-(x-1)}$ are disposed between the top and bottom dies. The dies of the die stack can be of the same type and/or size. Providing a die stack having chips which are different types and/or sizes is also useful.

The dies, for example, includes TSV contacts 150 and for coupling to terminals of the power module 120. The power module is disposed on the bottom die surface $110b_1$ of the bottom die. An RDL layer may be disposed on the top die surface for coupling the via contacts to the die pads. Additionally, the RDL of a die provides connections to TSV contacts of a die above. For example, the RDL of the $i^{th}$ die provides connections to the TSV contacts of the $i^{th}+1$ die. It is understood that not all dies need to have the same configurations. For example, the bottom die includes TSV contacts for connecting to the power source, the other dies include TSV contacts and RDLs for connecting an $i^{th}$ die to die pads of $i^{th}+1$ die, and the RDL of the top pad connects the power source to the top die pads.

Figure 3C:
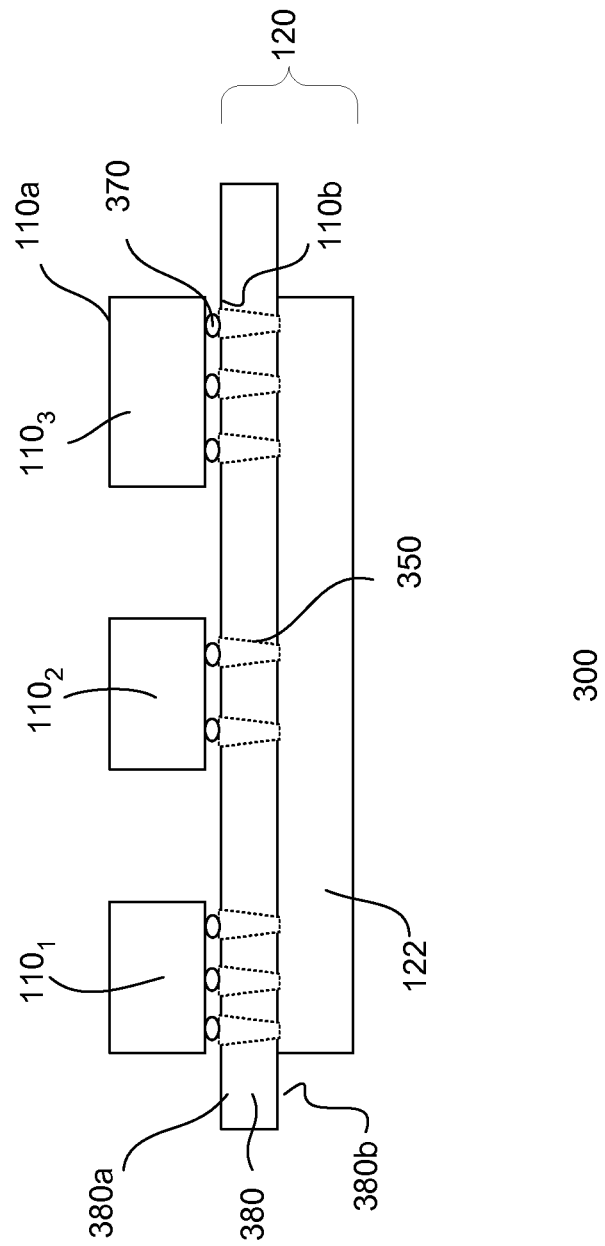

FIGS. 3a-c illustrate other embodiments of a semiconductor device 300. Referring to FIG. 3a, the semiconductor device 300 includes a power module 120 integrated into a die 110. In one embodiment, the power module includes a power source 122 and an interposer 380. The interposer serves as a support member on which the power source is disposed. The interposer may be formed of, for example, silicon. Other suitable types of materials may also be used in forming the interposer.

The interposer includes first and second interposer surfaces 380a-b. A dielectric layer (not shown) may line the major surfaces of the interposer. As shown, the power source is disposed on the second interposer surface while the die is disposed on the first interposer surface. In one embodiment, the interposer includes interposer contacts formed in through silicon vias formed through its surfaces. The interposer contacts, for example, are similar to the TSV contacts described in FIGS. 1a-b. The interposer contacts enable connections to the terminals of the power source disposed on the second interposer surface by the die disposed on the first interposer surface.

The die, for example, may include TSV contacts which provide connections on its bottom surface 110b to die pads on the top die surface 110a. An RDL may be disposed on the first major surface, providing connections between the interposer contacts to the TSV contacts of the die.

As shown, a single die is provided on the first major surface. It is understood that a die stack, as described in FIG. 2, may be provided on the first interposer surface. For example, the dies of the die stack may be coupled to the interposer contacts by TSV contacts. In other embodiments, the dies may be coupled by TSV contacts while the top die of the die stack is coupled to the interposer contacts by interconnect metal layers and bump connections.

In an alternative embodiment, as shown in FIG. 3b, a plurality of dies are disposed on the first interposer surface. For example, m number of dies may be disposed in a non-stacked configuration. Illustratively, three dies $110_{1-3}$ (e.g., m=3) are disposed on the first interposer surface. The dies, in one embodiment, include TSV type of dies. The dies may be coupled to the power source by TSV contacts. In other embodiments, the dies may include non-TSV type of dies, as shown in FIG. 3c. In such embodiments, the dies are coupled to the interposer contacts by bump connections 370. Other configurations of dies may also be useful. In some embodiments, the device may include die stacks, as described in FIGS. 2 and 3a, disposed on the first interposer surface. Also, providing a combination of die stacks and dies on the first interposer surface may also be useful.

As described, die or a set of dies are integrated with its own power module. Providing an integrated power module advantageously avoids the use of long power supply lines to provide power to the die or dies. Furthermore, such arrangement further reduces interconnect bus length and/or eliminate the use of some voltage regulator circuits. Therefore, the power consumption may be greatly reduced. In addition, the arrangement as described also enables more compact device to be formed. This allows for smaller product which incorporates the device to be produced, thus enhances portability.

Figure 4:
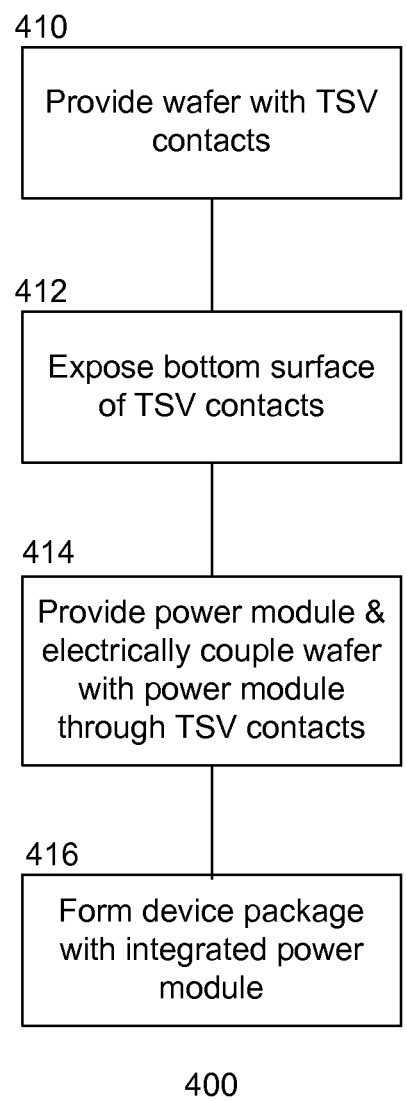
FIGS. 4-5 show flow charts of various embodiments of a process for forming a semiconductor device.

FIG. 4 shows a flow chart illustrating an embodiment of a process for forming a semiconductor device 400. The process includes providing a wafer, such as a large scale integration (LSI) wafer, being processed at step 410. The wafer, in one embodiment, includes a TSV type of die similar or the same as that described with respect to FIGS. 1a-c above. As such, common elements may not be described or described in detail. For example, the wafer is prepared with through silicon vias (TSVs). The wafer includes a wafer substrate having first (active) and second (inactive) major surfaces. The die, for example, includes a circuit component or a plurality of circuit components formed on the first or active surface of the die substrate. In one embodiment, the die includes a plurality of through silicon via (TSV) contacts formed in through silicon vias (TSVs) within the die substrate. The TSVs, for example, may be formed by deep reactive ion etching (DRIE) or laser drilling process. Other suitable techniques may also be used to form the TSVs. Insulation liners, for example, may be formed to line the sidewalls of the TSVs. The TSVs, in one embodiment, are filled by conductive material, such as copper (Cu), by electroplating process and are planarized using chemical mechanical polishing (CMP) to form the TSV contacts. Other suitable techniques and materials may also be used to form the TSV contacts.

The process continues by thinning the second surface or inactive surface of the wafer to reduce the thickness of the wafer. The second surface of the wafer, for example, is thinned by processes such as grinding, CMP, RIE, etc., or a combination thereof. The backgrinding process, for example, exposes the bottom of the TSV contacts at step 412.

At step 414, a power module is provided on the second major surface of the wafer. The power module includes a power source similar to that described with respect to FIGS. 1a-b. As described, the power source, in one embodiment, is a battery cell. The battery cell, for example, is a lithium battery cell. In another embodiment, the power source is a solar cell. Other types of power sources, such as NiMH battery may also be useful. In one embodiment, the power module is integrally formed or built on the second major surface of the wafer. In other embodiments, the power module may be separately formed and attached to the second major surface of the wafer. The process includes electrically coupling the power module and the circuit components on the first or active surface of the wafer through the TSV contacts at step 414.

The process may include further or additional processing steps to complete the fabrication of the semiconductor device. For example, the wafer can be diced or singulated to separate the wafer into individual dies with integrated power module and further processed to form a device package as shown in FIG. 1a-b at step 416. The process, in other embodiments, may further include mounting additional die or dies on top of the singulated die to form a die stack with integrated power module as shown in FIG. 2.

As described, the power module is integrated into the device of package. The circuit components on the active surface of the die are interconnected and powered directly with the battery cell disposed at the backside of the die through the TSV contacts. This advantageously avoids the use of long power supply lines to provide power to the die or dies. Moreover, such arrangement further reduces interconnect bus length and/or eliminate the use of some voltage regulator circuits. Therefore, the power consumption may be greatly reduced. In addition, the arrangement as described also enables more compact device to be formed. This allows for smaller product which incorporates the device to be produced, thus enhances portability. The embodiment as described with respect to FIG. 4 is a fully compatible process with the process of forming 3D ICs or package in the future.

Figure 5:
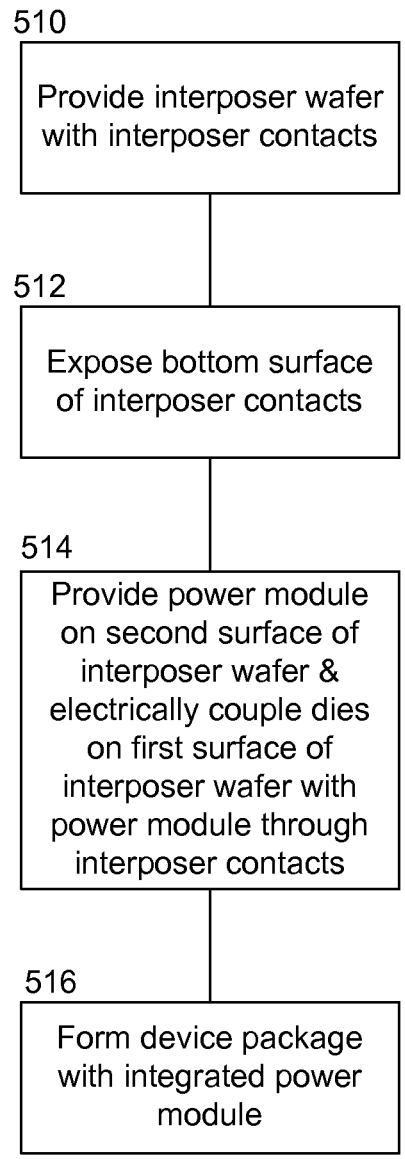

FIG. 5 shows a flow chart illustrating another embodiment of a process for forming a semiconductor device 500. The process includes providing a wafer having first and second major surfaces. The wafer, in one embodiment, serves as an interposer wafer at step 510. The interposer wafer, in one embodiment, includes a silicon wafer having a plurality of interposer contacts. The interposer contacts, for example, are similar to the TSV contacts as described in FIG. 4. The interposer contacts, for example, may be formed by similar process as described for the TSV contacts of FIG. 4. As such, common elements may not be described or described in detail.

The second or bottom surface of the interposer wafer is thinned to reduce the thickness of the wafer. The second surface of the interposer wafer, for example, is thinned by processes such as grinding, CMP, RIE, etc., or a combination thereof. The backgrinding process, for example, exposes the bottom of the interposer contacts at step 512.

At step 514, a power module is provided on the second major surface of the interposer wafer. The power module includes a power source similar to that described with respect to FIGS. 1*a-b*. As described, the power source, in one embodiment, is a battery cell. The battery cell, for example, is a lithium battery cell. In another embodiment, the power source is a solar cell. Other types of power sources, such as NiMH battery may also be useful. In one embodiment, the power module is integrally formed or built on the second major surface of the interposer wafer. In other embodiments, the power module may be separately formed and attached to the second major surface of the interposer wafer.

The process also includes providing a die or a plurality of dies at step 514 on the first surface of the interposer wafer. In one embodiment, the die may include TSV type of die similar or the same as that described with respect to FIGS. 1*a-c* above. In other embodiments, the die may include non-TSV type of die. The die or the plurality of dies having TSV contacts are mounted on the first major surface of the interposer wafer. The process includes electrically coupling the power module and the die or dies through the interposer contacts of the interposer wafer at step 514.

The process may include further or additional processing steps to complete the fabrication of the semiconductor device. For example, the interposer wafer can be diced or singulated to separate the wafer and further processed to form the individual device package with integrated power module as shown in FIG. 3*a-c* at step 516. The process, in other embodiments, may also include mounting additional die or dies on top of the device package to form a die stack device package with integrated power module.

The embodiment as described with respect to FIG. 5 includes some or all advantages as described with respect to FIG. 4. As such, these advantages will not be described or described in detail.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A semiconductor device comprising:
a die which includes a semiconductor die substrate having first and second major surfaces, the semiconductor die substrate comprises a plurality of vias extending from the first to the second major surface, wherein the vias are completely filled with conductive material to form through silicon via (TSV) contacts; and
a power module disposed on and directly contacts the second major surface of the die substrate, wherein the power module is electrically coupled to the die through the TSV contacts.

2. The semiconductor device of claim 1 wherein the power module comprises at least first and second conductive terminals.

3. The semiconductor device of claim 2 wherein the first major surface is an active substrate surface while the second major surface is an inactive substrate surface.

4. The semiconductor device of claim 3 wherein circuit components are disposed on the first major surface.

5. The semiconductor device of claim 2 wherein:
the first and second conductive terminals are planar conductive terminals; and
the TSV contacts are coupled to the first and second conductive terminals.

6. The semiconductor device of claim 5 wherein one of the at least first and second conductive terminals directly contacts the second major surface of the die substrate.

7. The semiconductor device of claim 5 wherein the power module includes lithium battery cell, solar cell or Nickel-Metal Hydride (NiMH) battery.

8. A semiconductor device comprising:
a die which includes a die substrate having first and second major surfaces;
a power module disposed below the second major surface of the die substrate; and
an interposer having first and second surfaces disposed in between the die and the power module, wherein the power module is electrically coupled to the die through silicon via (TSV) contacts which are disposed within the interposer.

9. The semiconductor device of claim 8 wherein the die is disposed on the first interposer surface while the power module is disposed on the second interposer surface.

10. The semiconductor device of claim 9 wherein the die is coupled to the interposer by TSV contacts within the die substrate or bump connections on the first interposer surface.

11. A method for forming a semiconductor device comprising:
providing a die which includes a semiconductor die substrate having first and second major surfaces, the semiconductor die substrate comprises a plurality of vias extending from the first to the second major surface, wherein the vias are completely filled with conductive material to form through silicon via (TSV) contacts; and
providing a power module on and directly contacts the second major surface of the die substrate, wherein the power module is electrically coupled to the die through the TSV contacts.

12. The method of claim 11 wherein the first major surface is an active substrate surface while the second major surface is an inactive substrate surface.

13. A method for forming a semiconductor device comprising:
providing a die which includes a die substrate having first and second major surfaces;
providing a power module below the second major surface of the die substrate, wherein the power module is electrically coupled to the die through silicon via (TSV) contacts; and
providing an interposer in between the die and the power module.

14. The method of claim 13 comprises forming the TSV contacts within the interposer.

15. A method for forming a semiconductor device comprising:
providing a wafer comprising a semiconductor substrate having first and second major surfaces, the semiconductor substrate comprises a plurality of vias extending from the first to the second major surface, wherein the vias are completely filled with conductive material to form through silicon via (TSV) contacts; and providing a power module on and directly contacts the second major surface of the semiconductor substrate of the wafer, wherein the power module is electrically coupled to the wafer through the TSV contacts.

16. The method of claim 15 wherein the wafer is processed with a plurality of dies having circuit components on the first major surface of the semiconductor substrate of the wafer.

17. The method of claim 16 wherein:

providing the wafer comprises forming TSV contacts within the semiconductor substrate of the wafer; and comprising thinning the second major surface of the semiconductor substrate of the wafer to expose bottom surfaces of the TSV contacts.

18. The method of claim 17 wherein providing the power module comprises integrally forming the power module directly on the second major surface of the semiconductor substrate of the wafer, and wherein the second major surface is an inactive substrate surface.

19. The method of claim 15 wherein:

the wafer serves as an interposer wafer, and comprises forming the TSV contacts within the interposer wafer.

20. The method of claim 19 further comprises providing a die or dies on the first major surface of the interposer wafer.

\* \* \* \* \*